United States Patent
Adler et al.

(10) Patent No.: US 6,683,009 B2
(45) Date of Patent: Jan. 27, 2004

(54) METHOD FOR LOCAL ETCHING

(75) Inventors: Frank Adler, München (DE); Guido Angenendt, München (DE)

(73) Assignee: Infineon Technologies AG, Munich (DE)

( * ) Notice: Subject to any disclaimer, the term of this patent is extended or adjusted under 35 U.S.C. 154(b) by 213 days.

(21) Appl. No.: 10/012,163

(22) Filed: Oct. 26, 2001

(65) Prior Publication Data

US 2002/0086535 A1 Jul. 4, 2002

(30) Foreign Application Priority Data

Oct. 26, 2000 (DE) .......................................... 100 53 198

(51) Int. Cl.$^7$ .............................................. H01L 21/00
(52) U.S. Cl. .................... 438/748; 156/345.18; 216/92; 216/99; 216/100; 438/745
(58) Field of Search ................. 216/2, 92, 99, 216/100, 101, 104, 103; 438/745, 748, 753, 754, 755, 756, 757; 156/345.17, 345.18

(56) References Cited

U.S. PATENT DOCUMENTS

| 3,043,362 A | * | 7/1962 | Mennesson | ................. 156/345 |
| 5,271,798 A | | 12/1993 | Sandhu et al. | |
| 5,788,779 A | | 8/1998 | Marchisseau et al. | |
| 5,871,584 A | | 2/1999 | Tateyama et al. | |

FOREIGN PATENT DOCUMENTS

JP          00124193 A          4/2000

* cited by examiner

Primary Examiner—William A. Powell
(74) Attorney, Agent, or Firm—Laurence A. Greenberg; Werner H. Stemer; Gregory L. Mayback

(57) ABSTRACT

A method is described for local etching of surfaces. The method includes the steps of providing a surface, providing an etchant, and providing a device for supplying and extracting the etchant. The device contains two cylindrical lines of different cross-sectional areas, of which the cylindrical line with the smaller cross-sectional area is guided inside the cylindrical line with the larger cross-sectional area. An etchant is fed through the inner line to the region of the semiconductor wafer that is to be etched, and the etchant that spreads out beyond the region of the surface that is to be etched is extracted through the outer line. The cross-sectional area of the outer line is less than or equal to the area of the region of the surface which is to be etched.

20 Claims, 1 Drawing Sheet

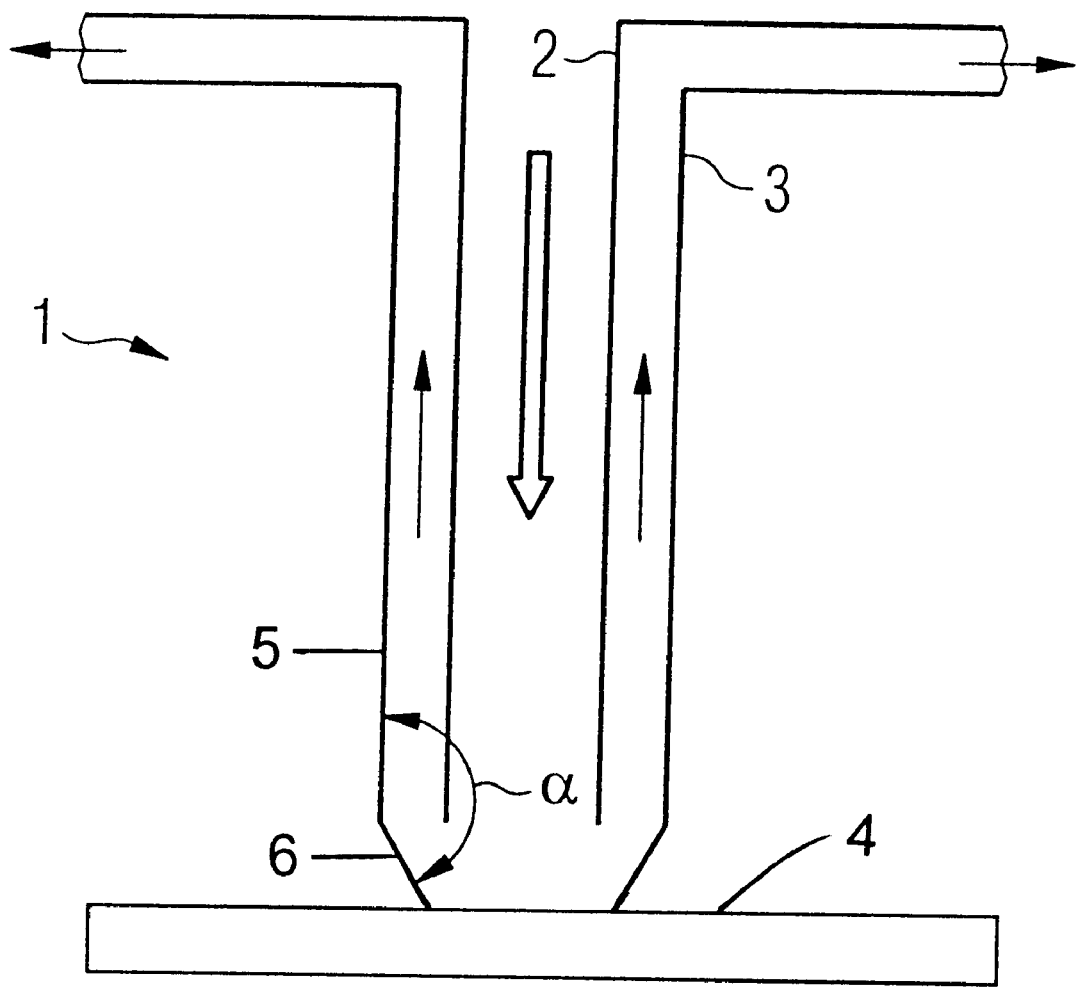

METHOD FOR LOCAL ETCHING

BACKGROUND OF THE INVENTION

Field of the Invention

The invention relates to a method for local etching, in particular for use in semiconductor fabrication.

In a very wide range of fabrication methods used in the semiconductor industry, it is often necessary to etch very small holes with a diameter in the range from 1 μm to 1 cm. For process engineering reasons, wet-chemical etching methods are particularly suitable for this purpose. In the conventional procedure, only a small quantity of etching acid is applied to the surface that is to be etched, since there is a risk of the etching acid being dispersed and etching a larger area than desired.

Precision-accuracy etching has hitherto been achieved by laser-assisted etching. In this method, the etching acid is applied to a large area of the surface and is only made to react with the surface in a targeted manner in the region that is to be etched by irradiation with a laser and action of the laser energy. However, this method can only be used for materials that do not inherently react with the acid, i.e. without additional excitation. Moreover, the method is relatively complex in terms of equipment.

SUMMARY OF THE INVENTION

It is accordingly an object of the invention to provide a method for local etching which overcomes the above-mentioned disadvantages of the prior art methods of this general type, which allows locally restricted, accurate etching, in particular wet-chemical etching.

With the foregoing and other objects in view there is provided, in accordance with the invention, a method for local etching of surfaces. The method includes providing a surface to be etched; providing an etchant; and providing a device for supplying and extracting the etchant. The device has two cylindrical lines with different cross-sectional areas. The two cylindrical lines include an outer line and a inner line being guided inside the outer line and having a smaller cross-sectional area than the outer line, and the cross-sectional area of the inner line is less than or equal to an area of a region of the surface to be etched. The etchant is fed to the region of the surface to be etched through the inner line and the etchant which spreads out beyond the region of the surface to be etched is extracted through the outer line.

According to the invention, the etchant is applied directly to the surface through the inner line. The inner line is surrounded by the outer line, and the cross-sectional area of the inner line corresponds to at most the cross-sectional area of the region that is to be etched. The escaping etchant is extracted through the outer line as soon as it spreads beyond the region that is to be etched.

The method according to the invention allows etching of a locally very restricted region of the surface, in particular of a surface of a semiconductor wafer. The risk of the etching liquid spreading out over the surface, as in conventional methods, is minimized.

According to a preferred embodiment of the present invention, the inner line is configured as a hollow cylinder, and the diameter of the inner hollow cylinder is between 1 μm and 1 cm, in particular between 2 μm and 1 mm. A diameter of the inner hollow cylinder of between 3 μm and 100 μm, in particular between 4 μm and 50 μm, is particularly preferred. The diameter of the inner hollow cylinder is very particularly preferably between 5 μm and 20 μm, in particular between 6 μm and 10 μm.

Embodiments according to which the outer line is configured as a hollow cylinder and the diameter of the outer hollow cylinder is at least five times as great as the diameter of the inner hollow cylinder are preferred. It is particularly preferable for the diameter of the outer hollow cylinder to be at least twice as great as the diameter of the inner hollow cylinder. According to a very particularly preferred embodiment, the diameter of the outer hollow cylinder is at least 1.5 times as great as the diameter of the inner hollow cylinder.

To ensure the required flexibility when positioning the device for supplying and extracting the etchant, it is preferable to use embodiments in which the thickness of the walls of the inner and outer lines is between 5 μm and 1 mm, and embodiments in which the thickness of the walls is between 10 μm and 100 μm are particularly preferred.

The material from which the device for supplying and extracting the etching acid is made should have two important properties. First, the material should be inert with respect to the etchant, and second it should be possible to form the material into relatively thin-walled lines which nevertheless have sufficient resistance to breaking or deformation. According to a preferred embodiment of the present invention, therefore, the lines are formed from glass, steel or plastic.

The etchant must etch the surface which is to be etched at a sufficient rate, but must not attack the walls of the lines. According to a preferred embodiment of the present invention, aqueous solutions of HF, HCl, $HNO_3$, $H_2SO_4$ or mixtures thereof are used as the etchant.

The material to be etched is preferably a dielectric, a metal, a metal-containing compound, a transition metal silicide or a transition metal nitride. The materials $SiO_2$, $Si_4N_3$, $Al_2O_3$, $TaO_2$ WN, $WSi_x$, CoSi and TaSi are particularly preferred.

Embodiments in which an inlet opening of the outer line, through which the excess etchant is extracted, is at a shorter distance from the surface to be etched than an outlet opening of the inner line, through which the etchant is fed to the surface, have proven particularly advantageous.

Particularly with a view to effective extraction of the excess etchant, embodiments in which the wall of the outer line, in the region of the inlet opening, is bent inward at an angle α<180° have proven advantageous. Embodiments in which the wall is bent inward at an angle α<150° are preferred.

As indicated above, the region of the surface that is to be etched may not only be circular but may also be square or have a certain aspect ratio. According to the invention, the inner and/or outer line, in cross section, may likewise not only be circular but may also be elliptical or polyhedral, in particular rectangular. An inner and/or outer line with a rectangular cross section is advantageously used if the region to be etched is not circular, but rather has a certain aspect ratio, since then the shape of the cross section of the lines can be matched to the shape of the region that is to be etched.

Generally, however, the inner and/or outer line will be circular in cross section. A region with a defined aspect ratio can then only be etched if the wall of the outer line, in the region of the inlet opening of the outer line, is bent inward at different angles of 180°>α>90°.

The greater the extent to which the wall is bent inward, i.e. the smaller the angle α, the less able the etchant is to spread out around the region of the outlet opening of the inner line, since it is immediately extracted again through the outer hollow cylinder. If the wall of the outer line is bent inward to a lesser extent, i.e. there is a larger angle α, the etchant which spreads out will only be extracted through the outer line at a later stage, and can therefore spread out further around the outlet cross section of the inner hollow cylinder.

Angles α that differ around the periphery of the inlet opening of the outer line also allow a non-circular region to be etched. A relatively great difference between the angles α which are present for different segments of the inlet cross section of the outer line enables higher aspect ratios of the region to be etched to be achieved.

The size of the angle α depends on the etching rate of the etchant for the particular material that is to be etched and is therefore dependent on the material of the surface, the etchant and its dilution. The outer cross section of the outer line is slightly smaller than the opening that is to be etched, so that the device can be moved downward as etching progresses.

Other features which are considered as characteristic for the invention are set forth in the appended claims.

Although the invention is illustrated and described herein as embodied in a method for local etching, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single figure of the drawing is a diagrammatic, cross-sectional view through a device for supplying and extracting an etching acid.

DESCRIPTION OF THE PREFERRED EMBODIMENT

Referring now to the single FIGURE of the drawing, there is shown a device 1 that has two hollow cylinders of different diameters, a hollow cylinder of a smaller diameter 2 being guided inside a hollow cylinder of larger diameter 3. An etching acid is fed to a region of a surface 4 of a semiconductor wafer that is to be etched through the inner hollow cylinder 2, while the etching acid which spreads beyond the region of the semiconductor wafer 4 which is to be etched is extracted through the outer hollow cylinder 3. A wall 5 of the outer hollow cylinder 3 is bent inward at an angle of approximately α=148° in the region of an inlet opening 6.

The embodiment shown in FIG. 1 is produced from two steel tubes, through which the etching acid is supplied and the excess etching acid is extracted again. The device 1 can be used, for example, to locally etch clear chip pads of an SDRAM through a dielectric layer (molding compound). In this case, the area that is to be etched is around 80×80 $\mu$m.

We claim:

1. A method for local etching of surfaces, which comprises the steps of:
   providing a surface to be etched;
   providing an etchant;
   providing a device for supplying and extracting the etchant, the device having two cylindrical lines with different cross-sectional areas, the two cylindrical lines include an outer line and a inner line being guided inside the outer line and having a smaller cross-sectional area than the outer line, and the cross-sectional area of the inner line being less than or equal to an area of a region of the surface to be etched;
   feeding the etchant to the region of the surface to be etched through the inner line; and
   extracting the etchant which spreads out beyond the region of the surface to be etched through the outer line.

2. The method according to claim 1, which comprises forming the inner line as a hollow cylinder having a diameter between 1 $\mu$m and 1 cm.

3. The method according to claim 2, which comprises setting the diameter of the inner hollow cylinder to be between 3 $\mu$m and 100 $\mu$m.

4. The method according to claim 3, which comprises setting the diameter of the inner hollow cylinder to be between 5 $\mu$m and 20 $\mu$m.

5. The method according to claim 2, which comprises forming the outer line as a hollow cylinder having a diameter being at least 1.5 times as great as the diameter of the inner hollow cylinder.

6. The method according to claim 5, which comprises forming the diameter of the outer hollow cylinder to be at least twice as great as the diameter of the inner hollow cylinder.

7. The method according to claim 6, which comprises forming the diameter of the outer hollow cylinder to be at least five times as great as the diameter of the inner hollow cylinder.

8. The method according to claim 1, which comprises forming a thickness of walls of the inner line and of the outer line to be between 5 $\mu$ and 1 mm.

9. The method according to claim 8, which comprises forming the thickness of the walls of the inner line and of the outer lines to be between 10 $\mu$m and 100 $\mu$m.

10. The method according to claim 1, which comprises forming the inner line and the outer line from a material selected from the group consisting of glass, steel and plastic.

11. The method according to claim 1, which comprises using an aqueous solution selected from the group consisting of HF, HCl, HNO$_3$, H$_2$SO$_4$ and mixtures thereof as the etchant.

12. The method according to claim 1, which comprises using one of a dielectric, a metal, a metal-containing compound, a transition metal silicide and a transition metal nitride as a material to be etched.

13. The method according to claim 12, which comprises using a material selected from the group consisting of SiO$_2$, Si$_4$N$_3$, Al$_2$O$_3$, TaO$_2$, WN, WSi$_x$, CoSi and TaSi as a material to be etched.

14. The method according to claim 1, which comprises forming the outer line with an inlet opening to be at a shorter distance from the surface to be etched than an outlet opening of the inner line.

15. The method according to claim 14, which comprises forming a wall of the outer line, in a region of the inlet opening, to be bent inward at an angle α<180°.

16. The method according to claim 15, which comprises forming the wall of the outer line, in the region of the inlet opening, to be bent inward at the angle α<150°.

17. The method according to claim 15, which comprises forming the wall of the outer line, in the region of the inlet opening, to be bent inward over a circumference at different angles of 180°>α>90°.

18. The method according to claim 1, which comprises forming the inner line as a hollow cylinder having a diameter between 2 $\mu$m and 1 mm.

19. The method according to claim 2, which comprises setting the diameter of the inner hollow cylinder to be between 4 $\mu$m and 50 $\mu$m.

20. The method according to claim 3, which comprises setting the diameter of the inner hollow cylinder to be between 6 $\mu$m and 10 $\mu$m.

* * * * *